(12) United States Patent
Hua (10) Patent No.: US 7,111,771 B2
(45) Date of Patent: Sep. 26, 2006

(54) SOLDERS WITH SURFACTANT-REFINED GRAIN SIZES, SOLDER BUMPS MADE THEREOF, AND METHODS OF MAKING SAME

(75) Inventor: Fay Hua, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 385 days.

(21) Appl. No.: 10/405,056

(22) Filed: Mar. 31, 2003

(65) Prior Publication Data
US 2004/0188503 A1 Sep. 30, 2004

(51) Int. Cl.
*B23K 31/02* (2006.01)
*H01L 23/48* (2006.01)
*C22C 13/02* (2006.01)

(52) U.S. Cl. .................. 228/180.22; 228/246; 148/24; 257/737; 420/562; 438/613

(58) Field of Classification Search ............ 228/180.22, 228/245, 246, 248.1, 248.5; 148/23, 24; 420/557–562; 438/613; 257/737, 738
See application file for complete search history.

(56) References Cited

U.S. PATENT DOCUMENTS

| | | | | |
|---|---|---|---|---|
| 3,925,110 A | * | 12/1975 | Prematta et al. ............ 148/564 |
| 5,011,658 A | * | 4/1991 | Niedrich ...................... 420/558 |
| 5,256,370 A | * | 10/1993 | Slattery et al. .............. 420/557 |
| 5,308,578 A | * | 5/1994 | Wong .......................... 420/558 |
| 5,435,857 A | * | 7/1995 | Han et al. ...................... 148/24 |
| 5,455,004 A | * | 10/1995 | Slattery et al. .............. 420/562 |
| 5,730,932 A | * | 3/1998 | Sarkhel et al. .............. 420/562 |
| 5,755,896 A | * | 5/1998 | Paruchuri et al. ........... 148/400 |
| 5,938,862 A | * | 8/1999 | Yeh et al. .................... 148/400 |
| 6,433,425 B1 | * | 8/2002 | Sarkhel ....................... 257/737 |
| 6,597,065 B1 | * | 7/2003 | Efland ......................... 257/712 |
| 6,649,127 B1 | * | 11/2003 | Habu et al. .................. 420/561 |
| 2001/0036420 A1 | * | 11/2001 | Matsunaga et al. ......... 420/562 |
| 2003/0007886 A1 | * | 1/2003 | Hwa et al. ................... 420/560 |
| 2003/0089923 A1 | * | 5/2003 | Oida et al. ................... 257/200 |

FOREIGN PATENT DOCUMENTS

| | | | |
|---|---|---|---|
| JP | 2000332144 A | * | 11/2000 |
| JP | 2000332144 | * | 11/2000 |
| JP | 02004082212 A | * | 2/2004 |
| WO | WO 97/43456 | * | 11/1997 |

OTHER PUBLICATIONS

Hua, F, "Creep behavior of Pb–free solders", *ASME International Mechanical Engineering Congress and Exposition, Proceedings, 2,* (2001),2283–2293.

Mei, Z, et al., "Effects of cooling rate on mechanical properties of near–eutectic tin–lead solder joints", *Journal of Electronic Materials,* 20(8), (Aug. 1991),599–608.

Morris Jr., John W., et al., "The Influence of Microstructure on the Failure of Eutectic Solders", *Design and Reliability of Solders and Solder Interconnections,* A Collection of papers from the 1997 TMS Annual Meeting in Orlando, Florida, Feb. 9–13, 1997,(Feb. 9–13, 1997.),49–58.

Shine, M C., "Fatigue of Solder Joints in Surface Mount Devices, Low Cycle Fatigue", *ASTM Special Technical Publication 942,* (1987),588–610.

Shine, M C., et al., "Strain range partioning procedure for solder fatigue", *Brazing & Soldering, 9,* (Autumn 1985), 11–14.

* cited by examiner

*Primary Examiner*—Kiley S. Stoner
(74) *Attorney, Agent, or Firm*—Schwegman, Lundberg, Woessner & Kluth, P.A.

(57) ABSTRACT

A doped tin-indium solder composition is disclosed. The doped tin-indium solder exhibits a retained fine-grain structure and superplasticity after significant thermal cycling and thermal and mechanical stresses experienced in a microelectronic package. A process of forming the doped tin-indium solder is also disclosed. A microelectronic package is also disclosed that uses the doped tin-indium solder composition. A method of assembling a microelectronic package is also disclosed. A computing system is also disclosed that includes the doped tin-indium solder.

31 Claims, 4 Drawing Sheets

SOLDERS WITH SURFACTANT-REFINED GRAIN SIZES, SOLDER BUMPS MADE THEREOF, AND METHODS OF MAKING SAME

TECHNICAL FIELD

Disclosed embodiments relate to a refined grain size solder for use in a microelectronic device package. The refined grain size solder can exhibit superplastic behavior during ordinary thermal cycling of the microelectronic device package.

BACKGROUND INFORMATION

Description of Related Art

An integrated circuit (IC) die is often fabricated into a processor for various tasks. Increased speed in an IC die has required one die-fabricating path to include an interlayer dielectric layer (ILD) to have properties that are relatively weak and brittle with respect to the metallization of the die. The relatively weak and brittle ILD material gives rise to integration problems, where the packaged die is attached to a mounting substrate. Machine operation also causes the ILD materials to crack from thermal expansion stresses, among other reasons.

One problem that must be addressed in the connection of various different types of materials (i.e., microelectronic devices, substrates, heat slugs, etc.) is the coefficient of thermal expansion (CTE) for each material. The CTE is a measurement of the expansion and contraction of each material during heating and cooling cycles, respectively. These heating and cooling cycles occur during the operation of a microelectronic device and during power up and power down of the microelectronic device.

Although some CTE matching can be achieved, such as by filling a solder with CTE-matching fillers, some expansion and contraction of bonded structures with disparate CTEs can be inevitable.

BRIEF DESCRIPTION OF THE DRAWINGS

In order to understand the manner in which embodiments are obtained, a more particular description of various embodiments briefly described above will be rendered by reference to the appended drawings. Understanding that these drawings depict only typical embodiments that are not necessarily drawn to scale and are not therefore to be considered to be limiting of its scope, some embodiments will be described and explained with additional specificity and detail through the use of the accompanying drawings in which.

DETAILED DESCRIPTION

The following description includes terms, such as upper, lower, first, second, etc., that are used for descriptive purposes only and are not to be construed as limiting. The embodiments of a device or article described herein can be manufactured, used, or shipped in a number of positions and orientations. The terms "die" and "processor" generally refer to the physical object that is the basic workpiece that is transformed by various process operations into the desired integrated circuit device. A board is typically a resin-impregnated fiberglass structure that acts as a mounting substrate for the die. A die is usually singulated from a wafer, and wafers may be made of semiconducting, non-semiconducting, or combinations of semiconducting and non-semiconducting materials.

Reference will now be made to the drawings wherein like structures will be provided with like reference designations. In order to show the structure and process embodiments most clearly, the drawings included herein are diagrammatic representations of embodiments. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

Figure 1A:
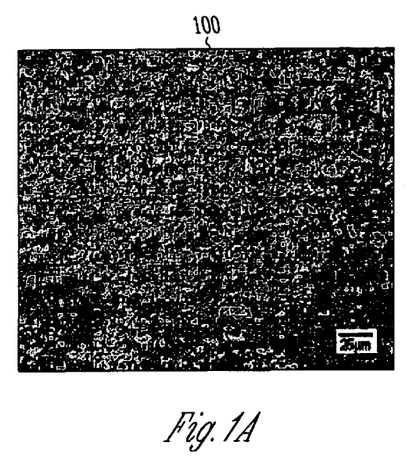
FIG. 1A is a computer image cross-section of a photomicrograph including a solder composition according to an embodiment.

FIG. 1A is a photomicrograph cross-section of a solder joint including a solder composition 100 according to an embodiment. The solder composition 100 includes, by weight percent, approximately Sn-10In-0.6Cu. In this depiction, the solder composition 100 includes about 10 percent indium, about 0.6 percent copper, and the balance tin. Other impurities may be present, based upon the specific feedstocks obtained and the chemical purities thereof.

Figure 1B:
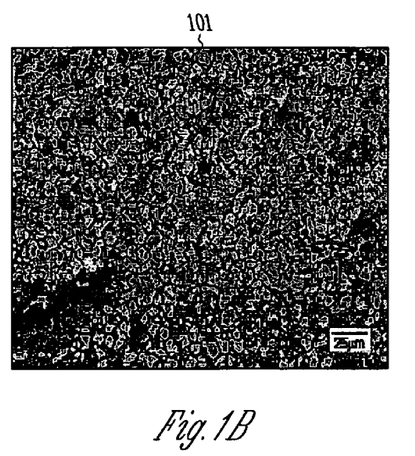
FIG. 1B is a computer image cross-section of the photomicrograph depicted in FIG. 1A after thermal processing.

FIG. 1B is a photomicrograph cross-section of a solder joint a solder composition 101 such as the composition depicted in FIG. 1A after thermal processing. Thermal processing conditions included about 110 hours at about 200° C. It is noted that the grain sizes and shapes are substantially unchanged after this significant thermal processing. In FIG. 1B, it is noted that mostly oval shaped and some rod-shaped grains of SnInCu are visible. In FIG. 1B, it is also noted that the grain size appears to be about 6 micrometer (micron) to about 13 micron.

Figure 2A:
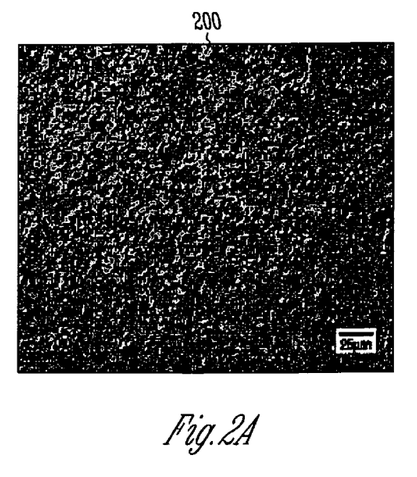
FIG. 2A is a computer image cross-section of a photomicrograph including a solder composition according to an embodiment.

FIG. 2A is a photomicrograph cross-section of a solder joint including a solder composition 200 according to an embodiment. The solder composition 200 includes, by weight percent, approximately Sn-10In-0.6Sb. Other impurities may be present, based upon the specific feedstocks obtained and the chemical purities thereof. In FIG. 2A, it is noted that the average grain size is from about 4 micron to about 8 micron. The irregular, eccentric grains have an aspect ratio, defined by the longest first distance across a centroid point of an individual grain, divided by the second distance across the centroid point orthogonal to the direction of the first distance, of about 1.01 to about 2.

Figure 2B:
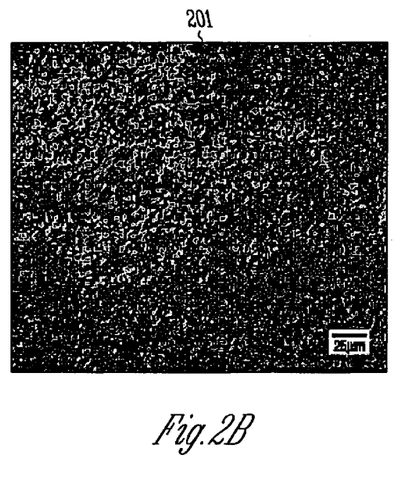
FIG. 2B is a computer image cross-section of the photomicrograph depicted in FIG. 2A after thermal processing.

FIG. 2B is a computer image cross-section of a photomicrograph solder composition 201 such as the composition 200 depicted in FIG. 2A after thermal processing. Thermal processing conditions included about 110 hours at about 200° C. It is noted that the grain sizes and shapes are substantially unchanged after this significant thermal processing. In FIG. 2B, it is noted that the grain size appears to be about 4 micron to about 8 micron.

Figure 3A:
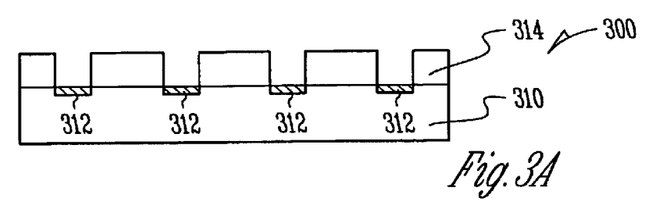
FIG. 3A is a cross section of a microelectronic device during processing according to an embodiment.

FIG. 3A is a cross section of a microelectronic device 300 during processing according to an embodiment. A substrate 310, such as one including a die, includes a bond pad 312 for electrical communication from the substrate 310 to the outside world. The microelectronic device 300 is depicted as being processed with a patterned mask 314 that exposes the bond pad 312. In one embodiment, the bond pad 312 is a copper upper metallization that can touch any one of several metallization layers. For example, a metallization such as metal one (M1, not pictured) in a simple microelectronic device makes electrical contact with the bond pad 312. In another example, a metallization such as metal two (M2, not pictured) makes electrical contact with the bond pad 312. The M2 makes electrical contact with the M1. In another example, a metallization such as metal three (M3, not pictured) makes electrical contact with the bond pad 312. The M3 makes electrical contact with the M2, which in turn makes electrical contact with the M1. In another example, a metallization such as metal four (M4, not pictured) makes electrical contact with the bond pad 312. The M4 makes electrical contact with the M3. The M3 makes electrical contact with the M2, which in turn makes electrical contact with the M1. In another example, a metallization such as metal five (M5, not pictured) makes electrical contact with the bond pad 312. The M5 makes electrical contact with the M4. The M4 makes electrical contact with the M3. The M3 makes electrical contact with the M2, which in turn makes electrical contact with the M1. In another example, a metallization such as metal six (M6, not pictured) makes electrical contact with the bond pad 312. The M6 makes electrical contact with the M5. The M5 makes electrical contact with the M4. The M4 makes electrical contact with the M3. The M3 makes electrical contact with the M2, which in turn makes electrical contact with the M1. In another example, a metallization such as metal seven (M7, not pictured) makes electrical contact with the bond pad 312. The M7 makes electrical contact with the M6. The M6 makes electrical contact with the M5. The M5 makes electrical contact with the M4. The M4 makes electrical contact with the M3. The M3 makes electrical contact with the M2, which in turn makes electrical contact with the M1. By this disclosure, it becomes clear that various semiconductor substrate structures are applicable to the various embodiments.

Figure 3B:
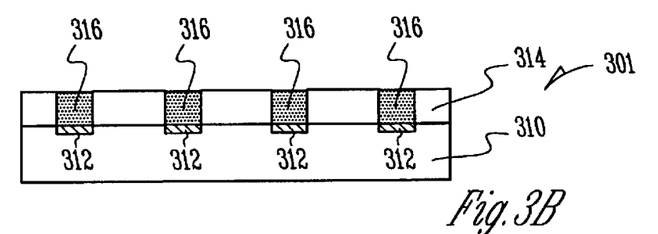
FIG. 3B is a cross section of the microelectronic device depicted in FIG. 3A after further processing.

FIG. 3B is a cross section of the microelectronic device 301 depicted in FIG. 3A after further processing. The patterned mask 314, which in one embodiment is a patterned photoresist, has been filled with a solder precursor such as a fluxed solder powder 316, also referred to as a solder paste 316, according to the various embodiments set forth in this disclosure.

In one embodiment, the solder paste 316 includes the flux vehicle as the fugitive binder for the solder paste 316 during processing. In one embodiment, no patterning per se is done, rather, a fluxed solder powder is blanket formed, and during reflow, the flux vehicle fluidizes and preferentially wets the bond pads, and preferentially becomes phobic of the substrate.

Figure 3C:
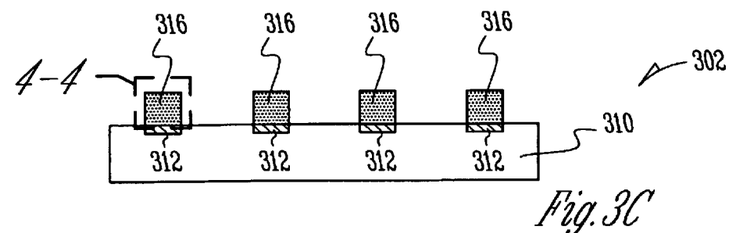
FIG. 3C is a cross section of the microelectronic device depicted in FIG. 3B after further processing.

FIG. 3C is a cross section of the microelectronic device 302 depicted in FIG. 3B after further processing. In this embodiment, the patterned mask 314 has been removed. Removal of the patterned mask 314 can be done by simply pulling it away from the substrate 310, and thereby leaving the fluxed solder powder 316 which is formed as discrete islands directly above the bond pads 312.

Figure 4:
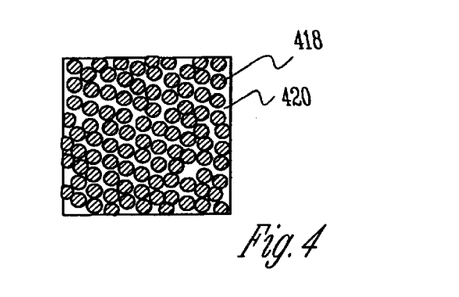
FIG. 4 is an enlargement of a portion of the microelectronic device depicted in FIG. 3C.

FIG. 4 is an enlargement of a portion of the microelectronic device depicted in FIG. 3C. FIG. 4 is taken from the area within the dashed line 4 depicted in FIG. 3C. FIG. 4 depicts a solder precursor as a solder powder 418 within a flux matrix 420. The solder powder 418 includes one of the solder composition embodiments set forth in this disclosure. Because the flux matrix 420 substantially protects the solder powder 418 from corrosive and/or oxidative influences, the solder powder 418 can remain substantially homogeneous during reflow. In one embodiment, the solder powder 418 has a diameter in a range from about 4 micron to about 1,000 micron.

Figure 3D:
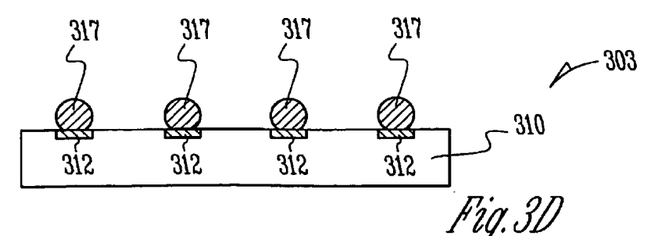
FIG. 3D is a cross section of the microelectronic device depicted in FIG. 3C after further processing.

FIG. 3D is a cross section of the microelectronic device 303 depicted in FIG. 3C after further processing. A reflow process has been commenced, during which the flux matrix 420 (FIG. 4) has been volatilized, and the solder powder 418 has reflowed into a solder bump 317 with a grain size and morphology similar to the structures depicted in FIGS. 1A and 2A, among others. The reflow process depicted for the microelectronic device 303 can precede a method of assembling a microelectronic device package, it can be simultaneous to other heat treatments of a microelectronic device package, or it can follow some elements of assembling a microelectronic device package. These and other embodiments are discussed subsequently.

FIGS. 3C and 3D also represent system embodiments. In one system embodiment, the system includes a solder embodiment as an electrical connector that is in contact with two electrical conductors. In FIG. 3D, the solder bump 317 is the electrical connector. A first electrical conductor in one embodiment is the recessed bond pad 518. A second electrical conductor in this embodiment is the mounting substrate bond pad 524. By review of embodiments in this disclosure, one can formulate clamed subject matter that includes a solder embodiment, a first electrical conductor, and a second electrical conductor.

One non-limiting embodiment includes an electrical cord, which is for plugging into a wall outlet. In this embodiment, the junctions between a prong of a plug and the wire in the electrical cord include the solder embodiment, the first electrical conductor, and the second electrical conductor. In this embodiment, a thermal stress can be created by resistive heating in the electrical cord. The solder embodiment can experience superplastic deformation.

In the following solder embodiments, all solders were or are made from feedstocks of purities about or exceeding 99.999 percent purity. In one embodiment, however, lower purity feedstocks can be used depending upon the conditions of a given application of the claimed subject matter. Alloy ingots were made by a vacuum arc melting technique. For example, a vacuum-sealed quartz tube can be used for production of solder ingots. After melting, the solders can be homogenized for a time range from about 1 hour to about 100 hours, in one embodiment for about 55 hours. The temperature during homogenization can be for a temperature range from about 120° C. to about 200° C., in one embodiment at about 180° C. Further processing can include a cold rolling operation to form a sheet. Other further processing can include extrusion to form wire. Yet other further processing can include powder compression for pelletizing.

In one embodiment, superplasticity behavior of the solder is observed. Superplasticity is understood to be a deformation of a metal structure without significant damage to the material.

Copper-Doped Tin-Indium Solders

In one embodiment, a copper-doped, tin-indium-based solder is prepared that contains from about 5 percent to about 15 percent indium. Copper doping is done in a range from about 0.01 percent to about 3 percent. In one embodiment, the copper-doped tin-indium solder embodiments exhibit a pseudo-eutectic, two-phase composition that includes about 1:1 $\alpha$:$\beta$ phases.

In one embodiment, a Sn-(7–10)In-(0.2–2)Cu solder is prepared. In one embodiment depicted in FIGS. 1A and 1B, a Sn-9In-0.6Cu solder was prepared by vacuum arc smelting and cooling at a rate from about 4° C./minute to about 2° C./minute. Cooling can be done either in the furnace or in an ambient-temperature gas. After the solder was homogenized for about 55 hours at about 180° C., the grain size was observed to be from about 6 micron to about 13 micron. The solder exhibited superplasticity as understood in the art.

In one embodiment, a copper-gallium-doped, tin-indium-based solder is prepared that contains from about 5 percent to about 15 percent indium. Copper-gallium doping is done in a 1:1 ratio with a copper-gallium doping concentration from about 0.01 percent to about 3 percent.

In one embodiment, a 1:1 CuGa, Sn-(7–10)In-(0.2–2) CuGa solder is prepared. In one embodiment, a Sn-9In-0.3Cu-0.3Ga solder is prepared. In one embodiment, at least one of Cd, Tl, Bi, and Pt is used to replace the Ga.

In one embodiment, a copper-antimony-doped, tin-indium-based solder contains from about 5 percent to about 15 percent indium. Copper-antimony doping is done with a copper-antimony doping concentration from about 0.01 percent to about 3 percent. In one embodiment, a 1:1 CuSb, Sn-(7–10)In-(0.2–2)CuSb solder is prepared. In one embodiment, a Sn-9In-0.3Cu-0.3Sb solder is prepared. In one embodiment, a Sn-9In-0.4Cu-0.2Sb solder is prepared. In one embodiment, at least one of Cd, Tl, Bi, and Pt is used to replace the Sb.

Antimony-Doped Tin-Indium Solders

In one embodiment, an antimony-doped, tin-indium-based solder contains from about 5 percent to about 15 percent indium. Antimony doping is done in a range from about 0.01 percent to about 3 percent. In one embodiment, the antimony-doped tin-indium solder embodiments exhibit a pseudo-eutectic, two-phase composition that includes about 1:1 $\alpha$:$\beta$ phases.

In one embodiment, a Sn-(7–10)In-(0.2–2)Sb solder is prepared. In one embodiment depicted in FIGS. 2A and 2B, a Sn-9In-0.6Sb solder was prepared by vacuum arc smelting and by cooling at a rate from about 4° C./minute to about 2° C./minute. Cooling is done either in the furnace or in an ambient-temperature gas. After the solder was homogenized for about 55 hours at about 180° C., a sample was prepared. The grain size was from about 4 micron to about 8 micron. The solder exhibited superplasticity as understood in the art.

In one embodiment, a Sn-9In-3Sb solder was prepared by vacuum arc smelting and by cooling at a rate from about 4° C./minute to about 2° C./minute. Cooling can be done either in the furnace or in an ambient-temperature gas. After the solder was homogenized for about 55 hours at about 180° C., the grain size was from about 3 micron to about 8 micron. The solder exhibited superplasticity as understood in the art. In one embodiment, a Sn-9In-0.3Sb-0.3Ag solder is prepared. In one embodiment, at least one of Cd, Tl, Bi, and Pt are used to replace the Ag. In one embodiment, a Sn-9In-0.2Sb-0.2Zn solder is prepared. In one embodiment, at least one of Cd, Tl, Bi, and Pt are used to replace the Zn.

Silver-Doped Tin-Indium Solders

In one embodiment, a silver-doped, tin-indium-based solder is prepared that contains from about 5 percent to about 15 percent indium. Silver doping is done in a range from about 0.01 percent to about 3 percent. In one embodiment, the silver-doped tin-indium solder embodiments exhibit a pseudo-eutectic, two-phase composition that includes about 1:1 $\alpha$:$\beta$ phases.

In one embodiment, a Sn-(7–10)In-(0.2–2)Ag solder is prepared. In one embodiment, a Sn-9In-0.4Ag solder was prepared by vacuum arc smelting and cooling at a rate from about 4° C./minute to about 2° C./minute. Cooling can be done either in the furnace or in an ambient-temperature gas. After the solder was homogenized for about 55 hours at about 180° C., the grain size was from about 7 micron to about 15 micron. The solder exhibited superplasticity as understood in the art. In one embodiment, a Sn-9In-0.2Ag-0.2Pb solder is prepared. In one embodiment, a Sn-9In-0.2Ag-0.2Ge solder is prepared. In one embodiment, at least one of Cd, Tl, Bi, and Pt is used to replace the Ge.

Nickel-Doped Tin-Indium Solders

In one embodiment, a nickel-doped, tin-indium-based solder is prepared that contains from about 5 percent to about 15 percent indium. Nickel doping is done in a range from about 0.01 percent to about 3 percent. In one embodiment, the nickel-doped tin-indium solder embodiments exhibit a pseudo-eutectic, two-phase composition that includes about 1:1 $\alpha$:$\beta$ phases.

In one embodiment, a Sn-(7–10)In-(0.2–2)Ni solder is prepared. In one embodiment, a Sn-9In-0.4Ni solder was prepared. The grain size was from about 6 micron to about 13 micron. The solder exhibited superplasticity as understood in the art. In one embodiment, a Sn-9In-0.2Ni-0.1Pt solder is prepared. In one embodiment, at least one of Cd, Tl, Bi, and Pt are used to replace the Pt. In one embodiment, a Sn-9In-0.2Ni-0.1Ag-0.1Ge solder is prepared.

Germanium-Doped Tin-Indium Solders

In one embodiment, a germanium-doped, tin-indium-based solder is prepared that contains from about 5 percent to about 15 percent indium. Germanium doping is done in a range from about 0.01 percent to about 3 percent. In one embodiment, the germanium-doped tin-indium solder embodiments exhibit a pseudo-eutectic, two-phase composition that includes about 1:1 $\alpha$:$\beta$ phases.

In one embodiment, a Sn-(7–10)In-(0.2–2)Ge solder is prepared. In one embodiment, a Sn-9In-0.4Ge solder was prepared. The grain size was from about 4 micron to about 8 micron. The solder exhibited superplasticity as understood in the art. In one embodiment, a Sn-9In-0.2Ge-0.2Pb solder is prepared. In one embodiment, at least one of Cd, Tl, Bi, and Pt are used to replace the Pb. In one embodiment, a Sn-9In-0.2Ge-0.2Cu solder is prepared.

Zinc-Doped Tin-Indium Solders

In one embodiment, a zinc-doped, tin-indium-based solder is prepared that contains from about 5 percent to about 15 percent indium. Zinc doping is done in a range from about 0.01 percent to about 3 percent. In one embodiment, the zinc-doped tin-indium solder embodiments exhibit a pseudo-eutectic, two-phase composition that includes about 1:1 $\alpha$:$\beta$ phases.

In one embodiment, a Sn-(7–10)In-(0.2–2)Zn solder is prepared. In one embodiment, a Sn-9In-0.4Zn solder was prepared. The grain size was from about 3 micron to about 8 micron. The solder exhibited superplasticity as understood in the art. In one embodiment, a Sn-9In-0.2Zn-0.2Pb solder is prepared. In one embodiment, a Sn-9In-0.2-Zn-0.2Ge solder is prepared. In one embodiment, at least one of Cd, Tl, Bi, and Pt are used to replace the Ge.

Aluminum-Doped Tin-Indium Solders

In one embodiment, an aluminum-doped, tin-indium-based solder is prepared that contains from about 5 percent to about 15 percent indium. Aluminum doping is done in a range from about 0.01 percent to about 3 percent. In one embodiment, the aluminum-doped tin-indium solder embodiments exhibit a pseudo-eutectic, two-phase composition that includes about 1:1 $\alpha$:$\beta$ phases.

In one embodiment, a Sn-(7–10)In-(0.2–2)Pb solder is prepared. In one embodiment, a Sn-9In-0.6Al solder was prepared. The grain size was from about 3 micron to about 7 micron. The solder exhibited superplasticity as understood in the art. In one embodiment, a Sn-9In-0.3Al-0.3Ga solder is prepared. In one embodiment, at least one of Cd, Tl, Bi, and Pt are used to replace the Ga. In one embodiment, a Sn-9In-0.2Al-0.2Zn-0.2Ge solder is prepared.

Figure 5A:
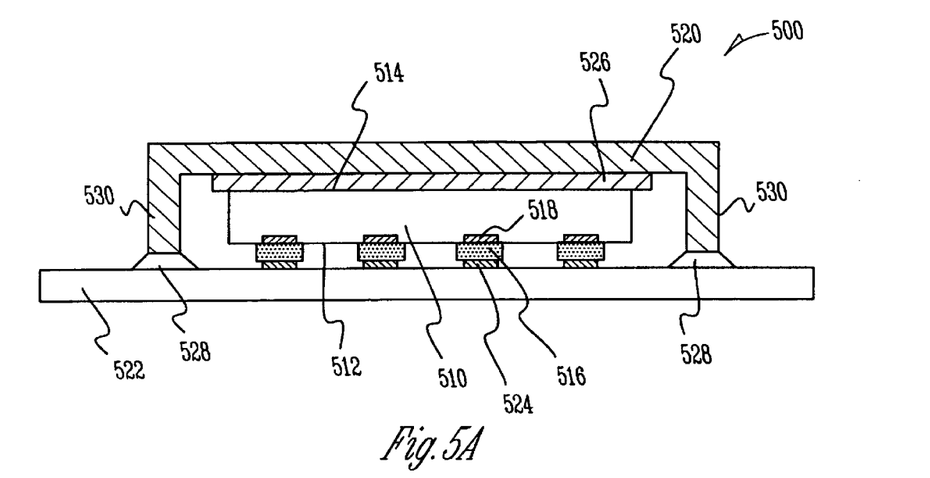
FIG. 5A is a cross section of a microelectronic device package according to an embodiment.

FIG. 5A is a cross section of a microelectronic device package 500 according to an embodiment. The microelectronic device package 500 includes a die 510 including an active surface 512 and a backside surface 514. In one embodiment, a fluxed solder powder 516 is provided on the active surface 512. A recessed bond pad 518 is disposed upon the active surface 512 and makes contact with the fluxed solder powder 516. In one embodiment, it is noted in FIG. 5A that the die 510 is disposed between an integrated heat spreader (IHS) 520 and a mounting substrate 522. The fluxed solder powder 516 is disposed on a mounting substrate bond pad 524. The fluxed solder powder 516 makes contact with the active surface 512 of the die 510.

The mounting substrate 522 can be any mounting substrate known in the art, such as a printed circuit board (PCB), a main board, a motherboard, a mezzanine board, an expansion card, or another mounting substrate. In one embodiment, a thermal interface material (TIM) 526 is disposed between the backside surface 514 of the die 510 and the IHS 520. In one embodiment, the TIM 526 is a thermal grease. In one embodiment, the TIM 526 is a solder. In one embodiment, the TIM 526 is a reactive solder that chemically bonds with the backside surface 514 during reflow processing. In one embodiment, the TIM 526 is a filled solder, such as a diamond-filled solder or a carbon fiber-filled solder.

It is noted that in FIG. 5A, the IHS 520 is attached with a bonding material 528 that secures a lip portion 530 of the IHS 520 thereto. By reading this disclosure, one recognizes that variations of the microelectronic device package 500 can be adapted to use of one of the several solder embodiments.

Figure 5B:
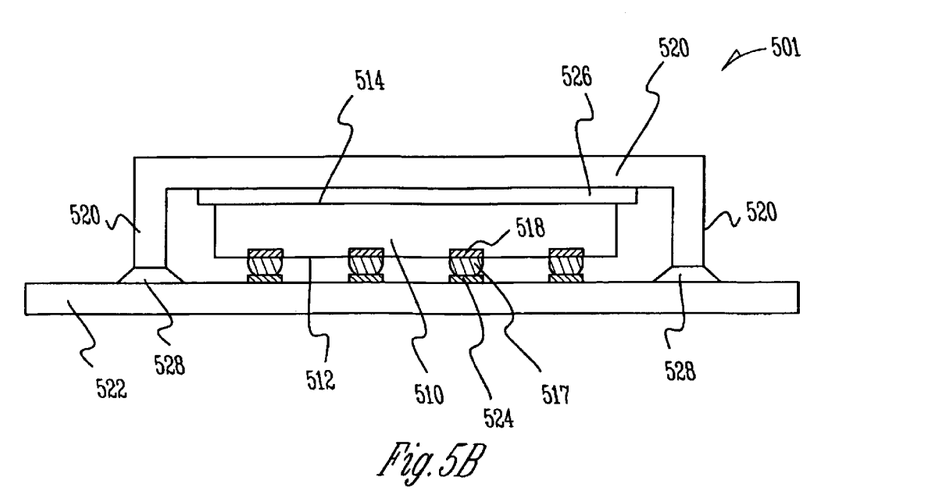
FIG. 5B is a cross section of the microelectronic device package depicted in FIG. 5A after further processing.

FIG. 5B is a cross section of the microelectronic device package 501 depicted in FIG. 5A after further processing. Reflow of the solder paste 516 (FIG. 5A) into a solder bump 517 and the TIM 526, or one of them in connection with the die 510, can be carried out by thermal processing. In one embodiment, heat is applied to a temperature that approaches or achieves the solidus temperature of the specific solder bump 517. In one embodiment, the solder bump 517 is heated to a range from about 150° C. to about 220° C. In one embodiment, the solder bump 517 is heated to about 180° C. In one embodiment, the solder bump 517 is heated to about 200° C.

Figure 6:
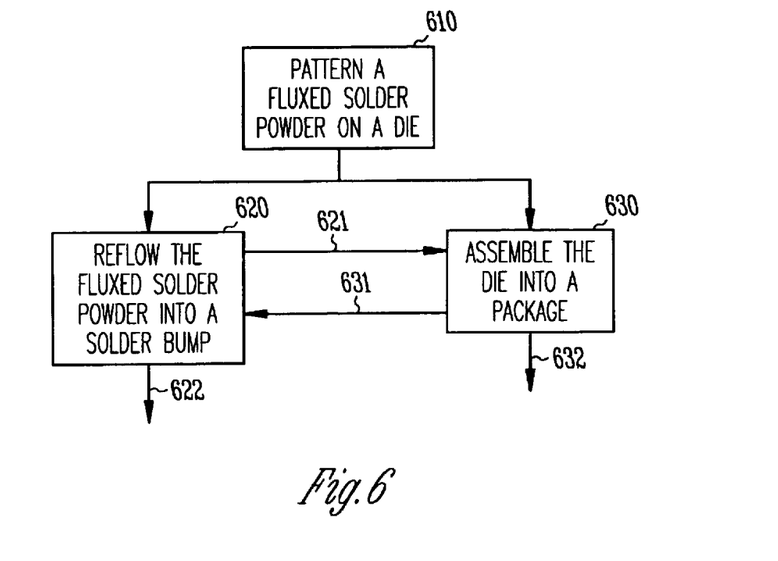
FIG. 6 is a process flow diagram according to various embodiments.

FIG. 6 is a process flow diagram according to various embodiments. Processing of the fluxed solder powder 316 (FIGS. 3B and 3C) or the fluxed solder powder 516 (FIG. 5A) is carried out during a process of forming a solder bump, and during a method of assembling a packaged die, respectively. At 610, a fluxed solder powder is patterned on a die. By way of illustration in FIG. 3B, a patterned mask 314 has been filled with a fluxed solder powder 316.

At 620, the fluxed solder powder is reflowed into a solder bump on the die. By way of illustration in FIG. 3D and FIG. 5B, the respective reflowed solder bumps 317 and 517 are depicted as forming a solder bump. At 621, the process flow can proceed from the process of reflowing the fluxed solder powder, to the method of assembling the die into a package. At 622, one process embodiment is completed.

At 630, the die including the solder or the fluxed solder powder is assembled into a package. By way of illustration, FIGS. 5A and 5B depict the assembly of a die 510 with at least a mounting substrate 522. Optionally, an IHS 520 or other heat sink substrate is also assembled with the fluxed solder powder 516 or the solder bump 517 and the die 510. At 631, the process flow can proceed from the method of assembling the die into a package, followed by the process of reflowing the fluxed solder powder into a solder bump. At 632, one method embodiment is completed.

Figure 7:
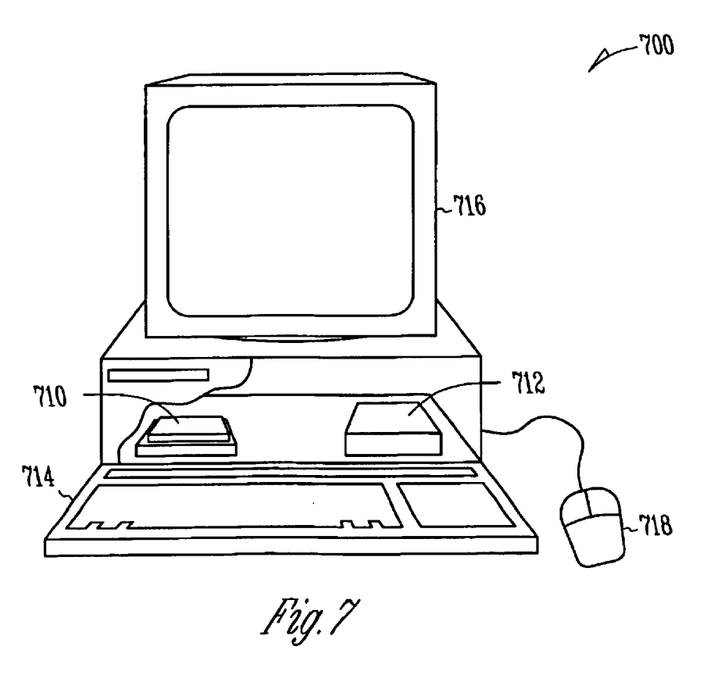
FIG. 7 is a depiction of a computing system according to an embodiment.

FIG. 7 is a depiction of a computer system 700 according to an embodiment. One or more of the foregoing embodiments of a doped tin-indium solder may be utilized in a computing system, such as a computing system 700 of FIG. 7. The computing system 700 includes at least one processor (not pictured), which is enclosed in a microelectronic device package 710, a data storage system 712, at least one input device such as keyboard 714, and at least one output device such as monitor 716, for example. The computing system 700 includes a processor that processes data signals, and may include, for example, a PENTIUM®III, a PENTIUM® 4, or a CENTRINO™ microprocessor, available from Intel® Corporation. In addition to the keyboard 714, the computing system 700 can include another user input device such as a mouse 718, for example.

For purposes of this disclosure, a computing system 700 embodying components in accordance with the claimed subject matter may include any system that utilizes a microelectronic device package, which may include, for example, a data storage device such as dynamic random access memory, polymer memory, flash memory, and phase-change memory. The microelectronic device package can also include a die that contains a digital signal processor (DSP), a micro controller, an application specific integrated circuit (ASIC), or a microprocessor.

It can now be appreciated that embodiments set forth in this disclosure can be applied to devices and apparatuses other than a traditional computer. For example, a die can be packaged with an embodiment of the doped tin-indium solder and placed in a portable device such as a wireless communicator or a hand-held device such as a personal data assistant and the like. Another example is a die that can be packaged with an embodiment of the doped tin-indium solder and placed in a vehicle such as an automobile, a locomotive, a watercraft, an aircraft, or a spacecraft.

It is emphasized that the Abstract is provided to comply with 37 C.F.R. § 1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description of Embodiments of the Invention, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A solder composition comprising:
   a tin base;
   from about 5 percent to about 15 percent indium; and
   from about 0.01 percent to about 3 percent of a dopant, wherein the dopant is selected from copper, zinc, nickel, germanium, antimony, silver, cadmium, tellurium, bismuth, platinum, lead, and a combination of at least two thereof, and wherein the solder composition has an average grain size from about 3 micron to about 15 micron.

2. The solder composition according to claim 1, wherein the solder includes about 9 percent indium, and about 0.6 percent copper, and wherein the solder composition has an average grain size from about 6 micron to about 13 micron.

3. The solder composition according to claim 1, wherein the solder includes about 9 percent indium, and about 0.4 percent nickel, and wherein the solder composition has an average grain size from about 6 micron to about 13 micron.

4. The solder composition according to claim 1, wherein the solder includes about 9 percent indium, and about 0.4 percent silver, and wherein the solder composition has an average grain size from about 7 micron to about 15 micron.

5. The solder composition according to claim 1, wherein the solder includes about 9 percent indium, and about 0.4 percent germanium, and wherein the solder composition has an average grain size from about 4 micron to about 8 micron.

6. The solder composition according to claim 1, wherein the solder includes about 9 percent indium, and about 0.6 percent aluminum, and wherein the solder composition has an average grain size from about 3 micron to about 7 micron.

7. The solder composition according to claim 1, wherein the solder includes about 9 percent indium, and about 0.4 percent zinc, and wherein the solder composition has an average grain size from about 3 micron to about 8 micron.

8. The solder composition according to claim 1, wherein the solder includes about 9 percent indium, and about 0.6 percent antimony, and wherein the solder composition has an average grain size from about 4 micron to about 8 micron.

9. The solder composition according to claim 1, wherein the solder includes about 9 percent indium, and less than or equal to about 3 percent antimony, and wherein the solder composition has an average grain size from about 3 micron to about 8 micron.

10. A process comprising:
    forming a solder precursor on a die, wherein the solder precursor includes:
       a Sn-(5–15)In solder including a dopant, from about 0.01 percent to less than about 3 percent, wherein the dopant is selected from copper, zinc, nickel, germanium, antimony, silver, cadmium, tellurium, bismuth, platinum, lead, and a combination of at least two thereof; and
       a flux vehicle; and
    reflowing the solder precursor under conditions to volatilize the flux vehicle, and to retain a grain size of the SN-(5–15)In solder in a range from about 2 micron to about 15 micron.

11. The process according to claim 10, before patterning the solder the process including:
    vacuum arc melting the SN-(5–15)In solder; and
    cooling the solder at a rate from about 2° C. to about 4° C.

12. The process according to claim 10, before patterning the solder the process including:
    melting the SN-(5–15)In solder; and
    homogenizing the solder for a time greater than about 1 hour and at a temperature less than about 200° C.

13. The process according to claim 10, before patterning the solder the process including:
    melting the SN-(5–15)In solder; and
    forming the solder into one selected from a fluxed powder, a sheet, a wire, and a pellet and combinations thereof.

14. A method of assembling a microelectronic device package, comprising:
    forming a solder precursor upon a die active surface, wherein the solder precursor includes a doped tin-indium metallization including a tin base, from about 5 percent to about 15 percent indium, and from about 0.01 percent to about 3 percent of a dopant, wherein the dopant is selected from copper, zinc, nickel, germanium, antimony, silver, cadmium, tellurium, bismuth, platinum, lead, and a combination thereof; and
    coupling the die to a mounting substrate, and wherein the solder composition has an average grain size from about 3 micron to about 15 micron.

15. The method of assembling a microelectronic device package according to claim 14, the method further including:
    reflowing the solder precursor, selected from reflowing before coupling the die, during coupling the die, after coupling the die, and a combination thereof.

16. The method of assembling a microelectronic device package according to claim 14, the method further including:
    connecting an integrated heat spreader to the die.

17. A packaging system comprising:
    a die including an active surface and a backside surface;
    a solder bump in contact with the active surface, wherein the solder bump includes:
       a tin base;
       from about 5 percent to about 15 percent indium; and
       from about 0.01 percent to about 3 percent of a dopant, wherein the dopant is selected from copper, zinc, nickel, germanium, antimony, silver, cadmium, tellurium, bismuth, platinum, lead, and a combination thereof; and
    a mounting substrate coupled to the die through the solder bump, and wherein the solder composition has an average grain size from about 3 micron to about 15 micron.

18. The packaging system according to claim 17, wherein the solder bump includes about 9 percent indium, and about 0.6 percent copper, and wherein the solder bump has an average grain size from about 6 micron to about 13 micron.

19. The packaging system according to claim 17, wherein the solder bump includes about 9 percent indium, and about 0.4 percent nickel, and wherein the solder bump has an average grain size from about 6 micron to about 13 micron.

20. The packaging system according to claim 17, wherein the solder bump includes about 9 percent indium, and about 0.4 percent silver, and wherein the solder bump has an average grain size from about 7 micron to about 15 micron.

21. The packaging system according to claim 17, wherein the solder bump includes about 9 percent indium, and about 0.4 percent germanium, and wherein the solder bump has an average grain size from about 4 micron to about 8 micron.

22. The packaging system according to claim 17, wherein the solder bump includes about 9 percent indium, and about 0.6 percent aluminum, and wherein the solder bump has an average grain size from about 3 micron to about 7 micron.

23. The packaging system according to claim 17, wherein the solder bump includes about 9 percent indium, and about 0.4 percent zinc, and wherein the solder bump has an average grain size from about 3 micron to about 8 micron.

24. The packaging system according to claim 17, wherein the solder bump includes about 9 percent indium, and about 0.6 percent antimony, and wherein the solder bump has an average grain size from about 4 micron to about 8 micron.

25. The packaging system according to claim 17, wherein the solder bump includes about 9 percent indium, and less than or equal to about 3 percent antimony, and wherein the solder bump has an average grain size from about 3 micron to about 8 micron.

26. A system comprising:
a microelectronic die disposed upon a mounting substrate;
a solder bump that couples the microelectronic die to the mounting substrate, the solder bump including:
a tin base;
from about 5 percent to about 15 percent indium; and
from about 0.01 percent to about 3 percent of a dopant, wherein the dopant is selected from copper, zinc, nickel, germanium, antimony, silver, cadmium, tellurium, bismuth, platinum, lead, and a combination thereof;
at least one of an input device and an output device coupled to the solder bump; and
data storage coupled to the microelectronic die.

27. The system according to claim 26, wherein the system is disposed in one of a computer, a wireless communicator, a hand-held device, an automobile, a locomotive, an aircraft, a watercraft, and a spacecraft.

28. The system according to claim 26, wherein the microelectronic die is selected from a data storage device, a digital signal processor, a micro controller, an application specific integrated circuit, and a microprocessor.

29. A system comprising:
a first electrical conductor;
a solder bump that is in contact with the first electrical conductor, the solder bump including:
a tin base;
from about 5 percent to about 15 percent indium; and
from about 0.01 percent to about 3 percent of a dopant, wherein the dopant is selected from copper, zinc, nickel, germanium, antimony, silver, cadmium, tellurium, bismuth, platinum, lead, and a combination thereof, and wherein the solder composition has an average grain size from about 3 micron to about 15 micron; and
a second electrical conductor that is in contact with the solder bump.

30. The system according to claim 29, wherein the first electrical conductor, the solder bump, and the second electrical conductor are part of a computing system.

31. The system according to claim 29, wherein the first electrical conductor, the solder bump, and the second electrical conductor are part of an electrical cord.

* * * * *

UNITED STATES PATENT AND TRADEMARK OFFICE
CERTIFICATE OF CORRECTION

| | | |
|---|---|---|
| PATENT NO. | : 7,111,771 B2 | Page 1 of 1 |
| APPLICATION NO. | : 10/405056 | |
| DATED | : September 26, 2006 | |
| INVENTOR(S) | : Hua | |

It is certified that error appears in the above-identified patent and that said Letters Patent is hereby corrected as shown below:

On the title page, in field (56), under "U.S. Patent Documents", in column 1, line 2, below "3,925,110 A * 12/1975 Prematta et al. ..... 148/564" insert -- 4,947,341 8/1990 Shine --.

On the title page, in field (56), under "Other Publications", in column 2, line 9, delete "Collection" and insert -- collection --, therefor.

On the title page, in field (56), under "Other Publications", in column 2, line 15, delete "partioning" and insert -- partitioning --, therefor.

In column 10, line 7, in Claim 10, delete "SN-(5–15)In" and insert -- Sn-(5–15)In --, therefor.

In column 10, line 11, in Claim 11, delete "SN-(5–15)In" and insert -- Sn-(5–15)In --, therefor.

In Column 10, line 16, in Claim 12, delete "SN-(5–15)In" and insert -- Sn-(5–15)In --, therefor.

In column 10, line 21, in Claim 13, delete "SN-(5–15)In" and insert -- Sn-(5–15)In --, therefor.

In column 12, line 3, In Claim 26, delete "thereof;" and insert -- thereof, and wherein the solder bump has an average grain size from about 3 micron to about 15 micron; --, therefor.

Signed and Sealed this

Nineteenth Day of August, 2008

JON W. DUDAS
*Director of the United States Patent and Trademark Office*